(12) United States Patent
Mine

(10) Patent No.: US 8,036,055 B2
(45) Date of Patent: Oct. 11, 2011

(54) SEMICONDUCTOR STORAGE DEVICE

(75) Inventor: Koji Mine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 344 days.

(21) Appl. No.: 12/320,323

(22) Filed: Jan. 23, 2009

(65) Prior Publication Data

US 2009/0196114 A1    Aug. 6, 2009

(30) Foreign Application Priority Data

Jan. 31, 2008  (JP) ............................... P2008-020779

(51) Int. Cl.
*G11C 29/00* (2006.01)
(52) U.S. Cl. .................... 365/201; 365/189.01; 365/233
(58) Field of Classification Search .................. 365/201, 365/189.01, 233, 233.5, 230.02, 230.08, 365/230.03
See application file for complete search history.

(56) References Cited

U.S. PATENT DOCUMENTS

2004/0151196 A1*  8/2004  Iwasaki .......................... 370/412
2007/0230245 A1*  10/2007  Watanabe et al. ......... 365/185.09

FOREIGN PATENT DOCUMENTS

JP    2003-151299    5/2003
* cited by examiner

*Primary Examiner* — Dang Nguyen
(74) *Attorney, Agent, or Firm* — McGinn IP Law Group PLLC

(57) ABSTRACT

A semiconductor storage device includes: a plurality of I/O terminals configured in a block, and including a representative I/O terminal and a non-representative I/O terminal; a plurality of memory cells each associated with the plurality of I/O terminals to store data; a data input portion to which data to be stored in the plurality of memory cells is input; and a data output portion which outputs data stored in the plurality of memory cells, the data input portion including a branch circuit which distributes the data input to the representative I/O terminal to all of the plurality of memory cells when the data to be stored in the plurality of memory cells is input while in test mode, and the data output portion including: a selection circuit which is connected to the representative I/O terminal, and which selects one of the data output from the plurality of memory cells and outputs the selected data from the representative I/O terminal when the data stored in the plurality of memory cells is output while in the test mode; and a dummy circuit which is provided between the non-representative I/O terminal and the memory cell associated with the non-representative I/O terminal.

14 Claims, 11 Drawing Sheets

| T4DQk | T4DQk+1 | T4DQk+2 | RBS |
|---|---|---|---|
| L | L | L | j/j+8/j+16/j+24 |
| H | L | L | j+1/j+9/j+17/j+25 |
| L | H | L | j+2/j+10/j+18/j+26 |
| H | H | L | j+3/j+11/j+19/j+27 |
| L | L | H | j+4/j+12/j+20/j+28 |
| H | L | H | j+5/j+13/j+21/j+29 |
| L | H | H | j+6/j+14/j+22/j+30 |
| H | H | H | j+7/j+15/j+23/j+31 |

SEMICONDUCTOR STORAGE DEVICE

BACKGROUND OF THE INVENTION

1. Field of the Invention

This invention relates to a semiconductor storage device, having a test function which shortens wafer tests.

Priority is claimed on Japanese Patent Application No. 2008-020779, filed Jan. 31, 2008, the content of which is incorporated herein by reference.

2. Description of Related Art

When manufacturing semiconductor storage devices, in order to perform processes efficiently when sealing chips into packages, defective chips are not processed. For this reason, characteristic and operation tests are performed in the wafer state insofar as possible to detect defective chips.

When performing tests in the wafer state, a plurality of probes (contact needles) provided on the probe card of a tester (semiconductor testing device) are brought into contact with the bonding pads of each chip. The tester exchanges control signals (signals controlling data writing and reading), data, and other signals with the chip, and by this means executes tests to judge whether each chip is defective or not.

A tester as described above includes numerous interfaces to perform input and output of the above described signals with a semiconductor storage device and driver circuits to output the various signals.

As semiconductor devices acquire more sophisticated functions, the number of chips on a wafer, and the number of input/output terminals (hereafter "I/O terminals") on each chip, increase. For this reason, when testing semiconductor devices formed on a wafer, limits are imposed on the number of interfaces to perform signal input/output and on the number of driver circuits to output the signals. As a result, testing of chips on a wafer must be performed in a plurality of sessions, and long lengths of time have been required for tests and inspections of semiconductor devices.

In order to shorten the time required for inspections, Japanese Unexamined Patent Application, First Publication No. 2003-151299 discloses the general semiconductor storage device shown in FIG. 8. There is a method in which, when the data input circuit and data output circuit in this semiconductor storage device have the structures shown in FIG. 9 and FIG. 10 respectively, probes are brought into contact with the bonding pads as explained below, and tests are performed.

A DQ shift test mode function is provided which, when for example there are 32 input/output data terminals, employs DQS (data strobe signals) to cause data output while shifting at every four I/O terminals and perform data writing and reading, in order to manage with a small number of pins to reduce the number of interface circuits and driver circuits.

Hence the probe card of the wafer tester has eight I/O pins connected in common, and probes must be contacted with the bonding pads of all the I/O terminals. Hence there is the problem that during design of the probe card, the number of probes is limited.

However, it is conceivable that, in response to the problem of the occurrence of limitations on the number of probes due to increases in the number of I/O terminals and the number of chips, when testing semiconductor storage devices having a plurality of output terminals, such as for example 32 input/output terminals corresponding to data input/output, tests may be performed by performing data input/output tests for a small number of four pins.

As a result, the probes of the probe card can be used efficiently, testing of numerous chips on the wafer can be performed, and the wafer test TAT (turn-around time) can be shortened.

On the other hand, when only four I/O terminals are selected and probes are contacted to perform tests, when there are 32 I/O terminals, tests of the remaining 28 I/O terminals are not performed, and so quality assurance of all the I/O terminals is not possible.

Hence by adopting a configuration in which a plurality of I/O terminals are consolidated into one block, and at the time of writing data are input to one among the I/O terminals comprised by the block, data are caused to be input to all I/O terminals for the block, and the number of probes can be greatly reduced (see for example Japanese Unexamined Patent Application, First Publication No. 2003-151299).

That is, in the case of the above configuration, when in the above-described DQ shift test mode, and when writing data as shown in the timing chart of FIG. 11, write operations to all I/O terminals are performed simultaneously, so that processing can be performed similarly to that of normal operation.

However, as shown in the timing chart of FIG. 12, when performing data reading the test mode signals TDQj to TDQj+7, which control activation and deactivation of the FIFO (First-In, First-Out) circuits for each of the I/O terminals, are respectively input.

Here, in FIG. 11, the same data are input to all of the bonding pads DQj to DQj+7. FIG. 11, the data WBSRj to WBSRj+7 on the clock rising side are all the same data, and the data WBSFj to WBSFj+7 on the clock falling side are all the same data. In FIG. 11 and FIG. 12, the timing chart for the other bonding pads DQj+8 to DQj+15, DQj+16 to DQj+23, DQj+24 to DQj+31, and for the bonding pads DQSi+1 to DQSi+3, are omitted, but are similar to the timing charts for the bonding pads DQj to DQj+7 and for the bonding pad DQSi.

By means of these test mode signals, one among the eight FIFO circuits connected in common to a single probe is activated and the others deactivated, so that there is no contention and collision of read-out data, and data read processing is performed in order for memory corresponding to each of the I/O terminals.

Hence during writing in the semiconductor device disclosed in Japanese Unexamined Patent Application, First Publication No. 2003-151299, write operation is performed by means of processing similar to that of normal operations, as described above, and so a special circuit is not needed. On the other hand, during reading, the result of comparing and combining the data corresponding to I/O terminals in each block is output, so that there is the problem that it is not possible to judge whether data corresponding to any of the I/O terminals is defective.

Further, this semiconductor device is configured such that the data resulting from combination of data in each block are output from one of the I/O terminals within the block. Consequently a circuit to switch the I/O terminal between normal operation and test mode is necessary. As a result, there is the drawback that differences in the delay times of data output in normal operation occur among the I/O terminals.

SUMMARY

In one embodiment, there is provided a semiconductor storage device that includes: a plurality of I/O terminals configured in a block, and including a representative I/O terminal and a non-representative I/O terminal; a plurality of memory cells each associated with the plurality of I/O terminals to store data; a data input portion to which data to be stored in the plurality of memory cells is input; and a data output portion which outputs data stored in the plurality of memory cells, the data input portion including a branch circuit which distributes the data input to the representative I/O terminal to all of the plurality of memory cells when the data to be stored in the plurality of memory cells is input while in test mode, and the data output portion including: a selection circuit which is connected to the representative I/O terminal, and which selects one of the data output from the plurality of memory cells and outputs the selected data from the representative I/O terminal when the data stored in the plurality of memory cells is output while in the test mode; and a dummy circuit which is provided between the non-representative I/O terminal and the memory cell associated with the non-representative I/O terminal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 8:
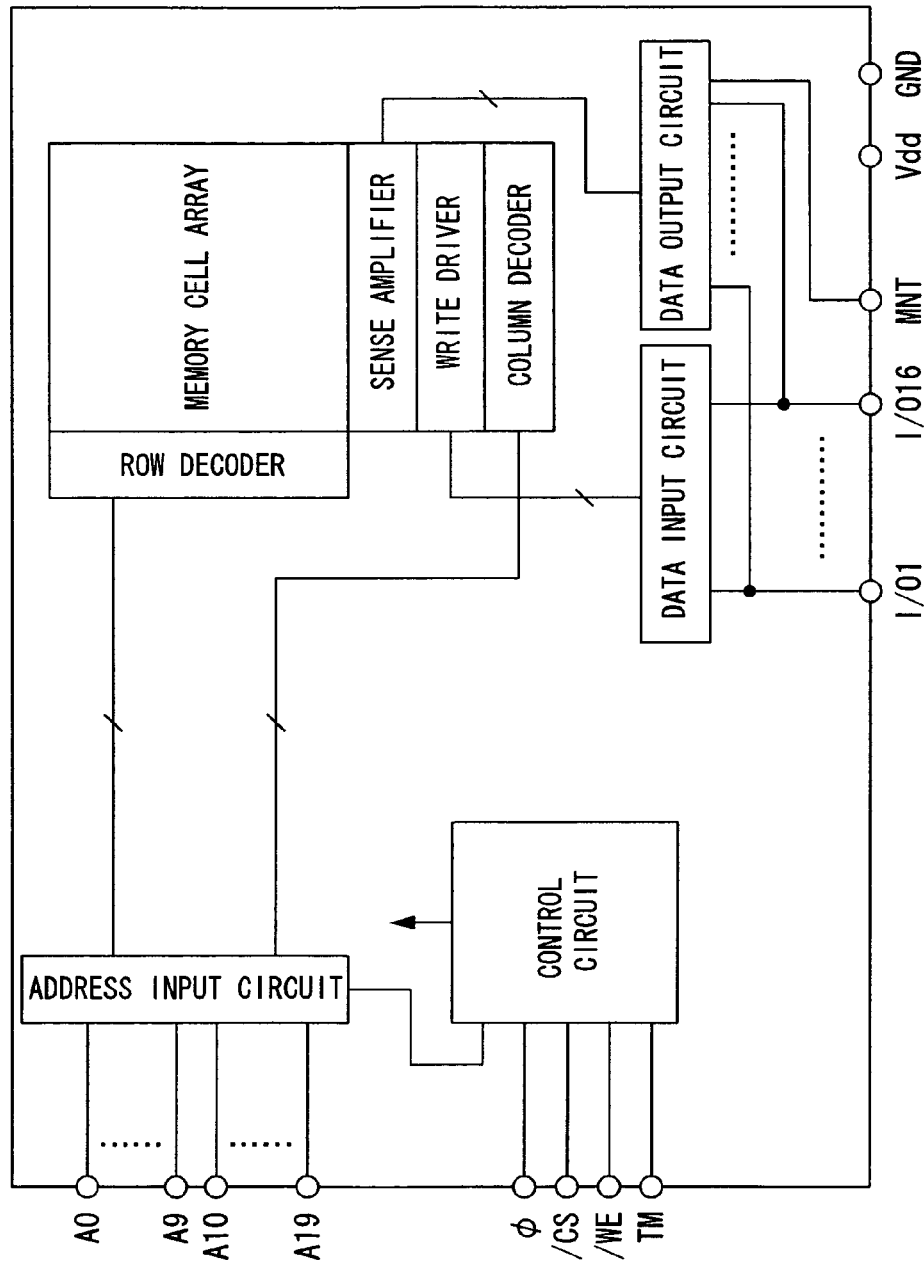
FIG. 8 is a block diagram showing an example of a configuration of a general semiconductor storage device.
Figure 9:
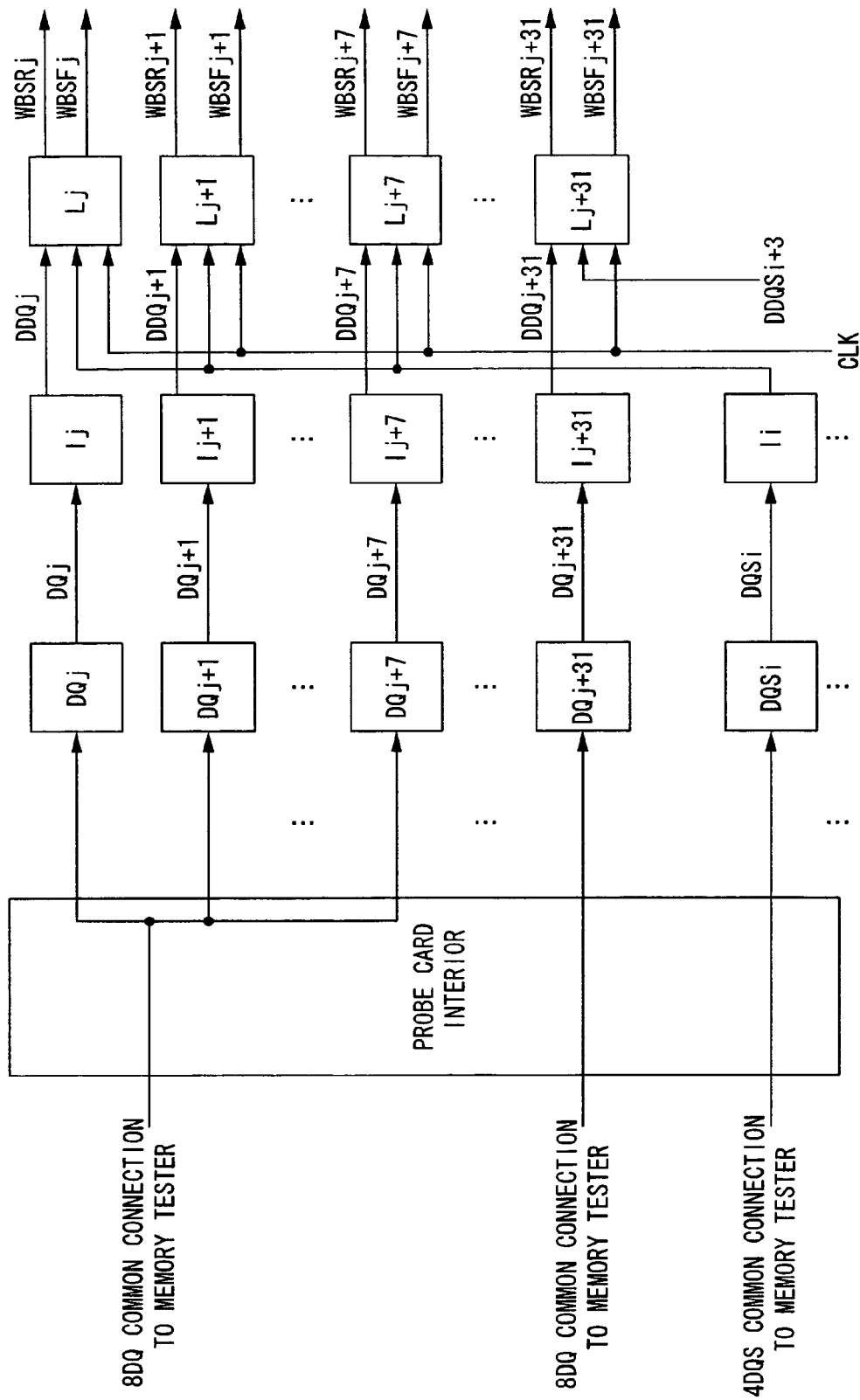
FIG. 9 is a block diagram showing a configuration of a data input circuit in an example of a related art.
Figure 10:
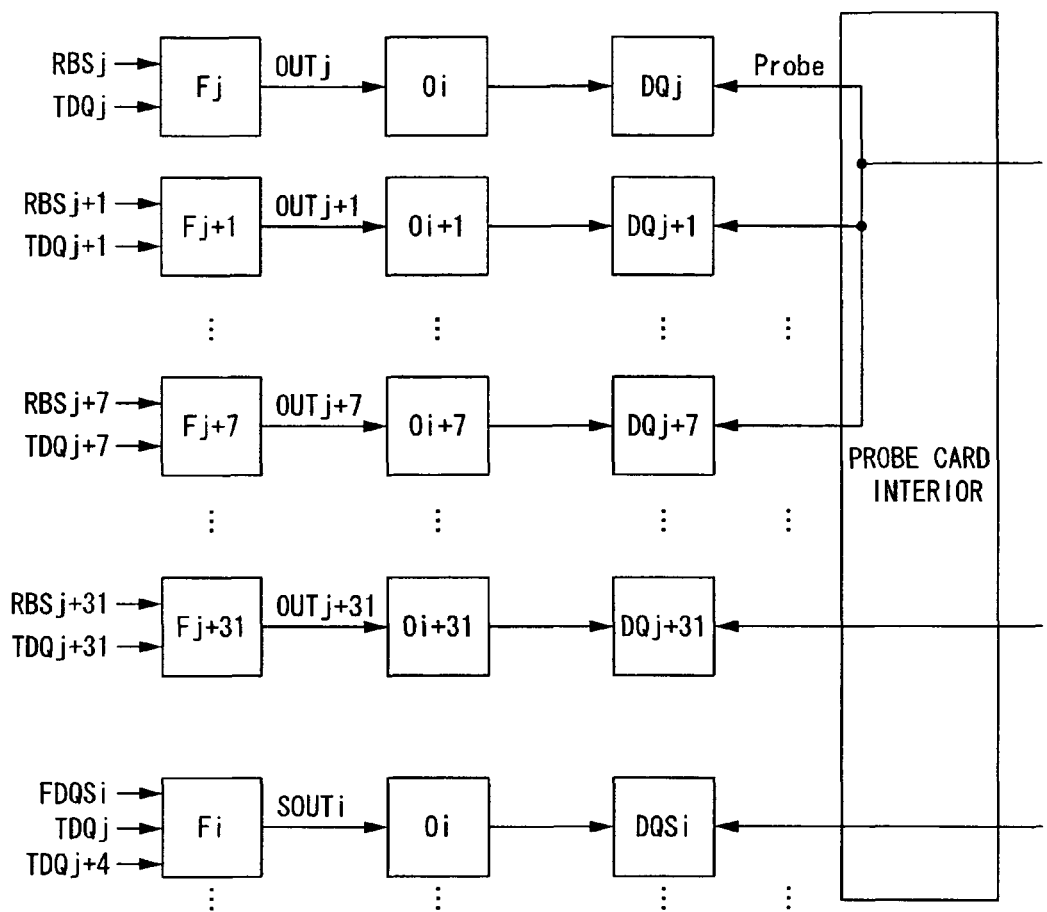
FIG. 10 is a block diagram showing a configuration of a data output circuit in an example of the related art.
Figure 11:
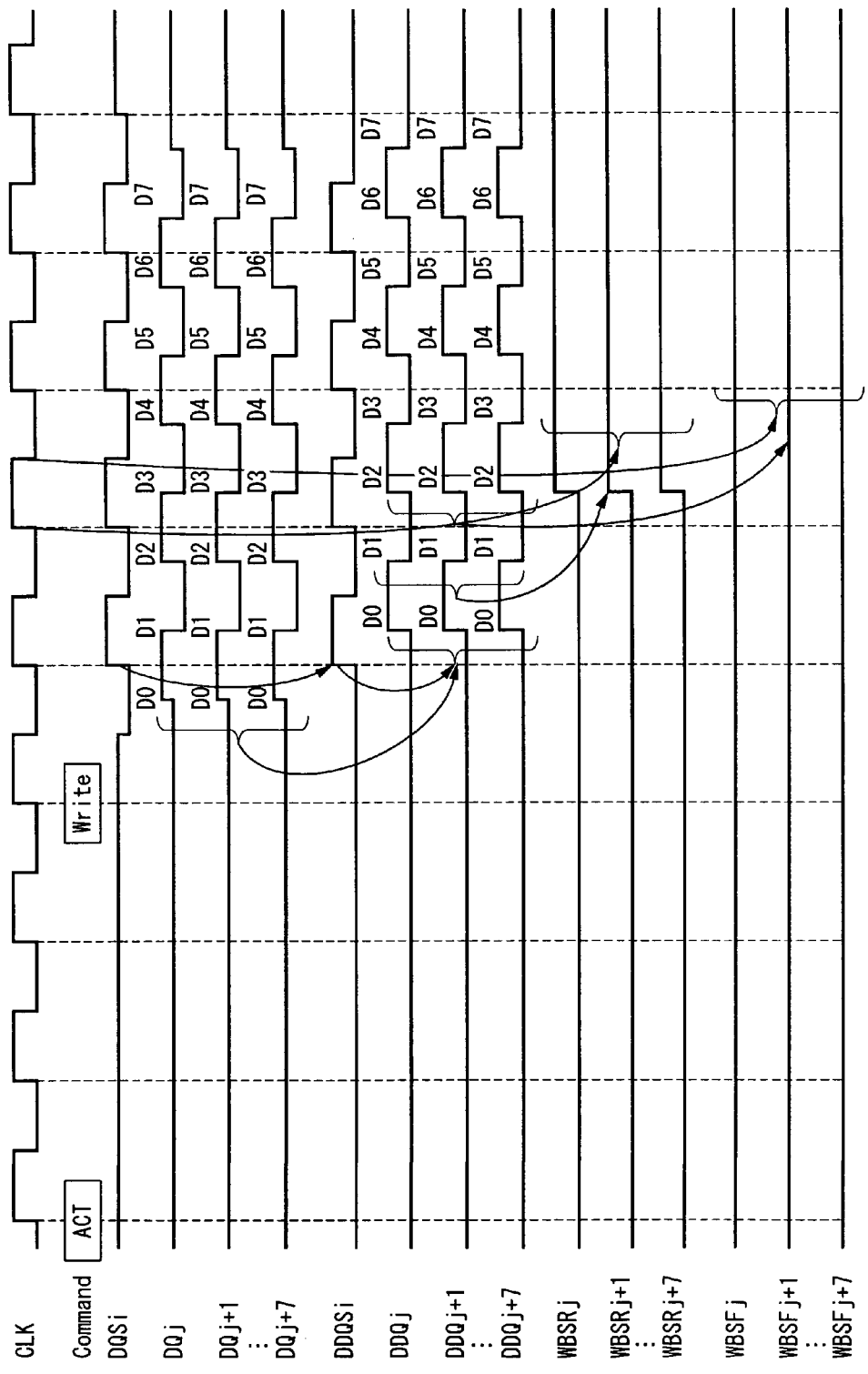
FIG. 11 is a timing chart showing operation of the data input circuit in the example of the related art.
Figure 12:
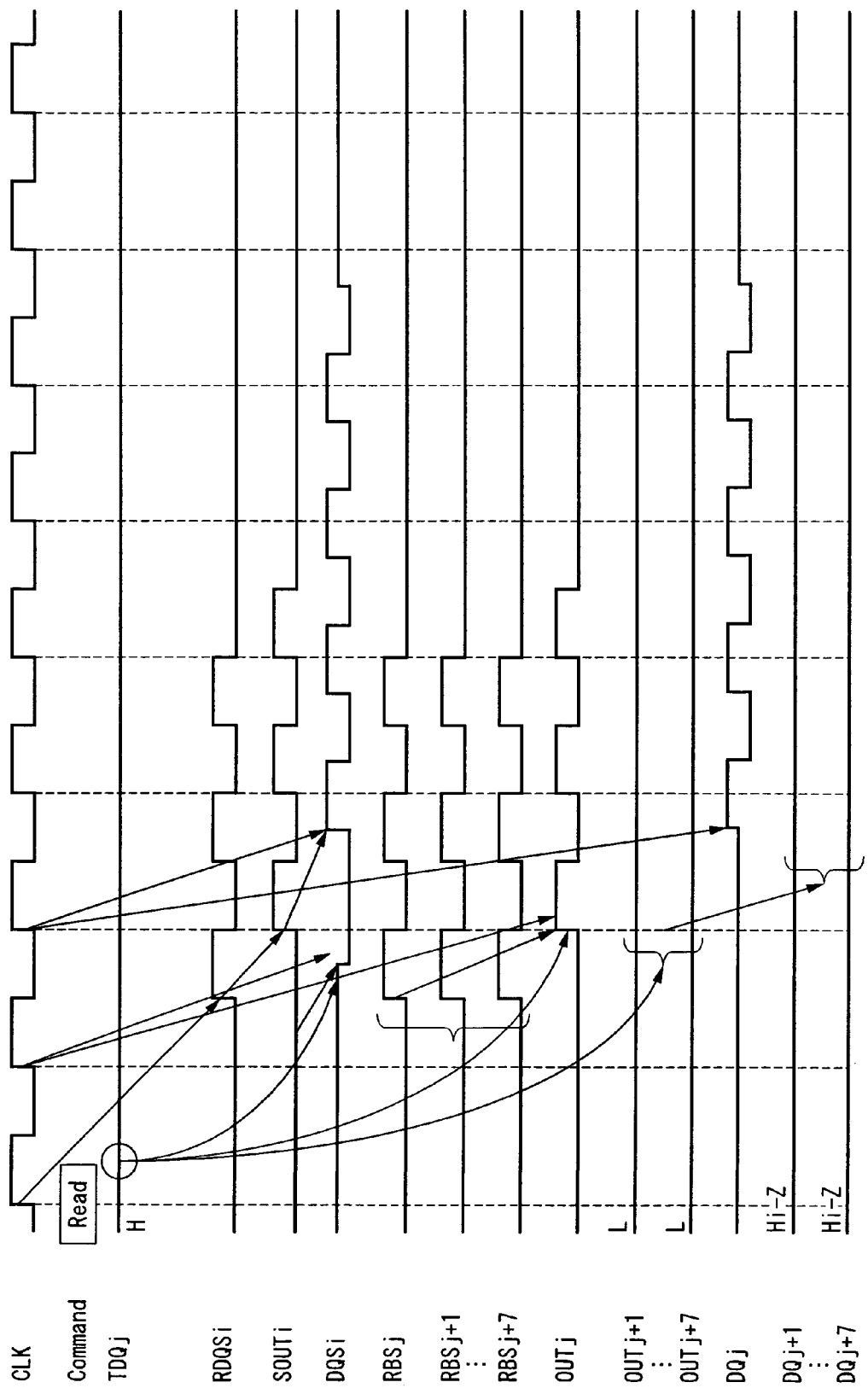
FIG. 12 is a timing chart showing operation of the data output circuit in the example of the related art.

Similarly to the semiconductor device shown in FIG. 8, a semiconductor device according to one embodiment of this invention has a plurality of memory cells which store data, a data input portion which inputs data to be stored in the plurality of memory cells, and a data output portion which outputs data stored in the plurality of memory cells.

The semiconductor device also has a plurality of I/O terminals configured in a block, and including a representative I/O terminal and a non-representative I/O terminal. The memory cells are each associated with the plurality of I/O terminals to store data.

The data input portion according to the embodiment has a branch circuit which distributes the data input to the representative I/O terminal to all of the plurality of memory cells when the data to be stored in the plurality of memory cells is input while in test mode.

The data output portion according to the embodiment includes a selection circuit which is connected to the representative I/O terminal, and which selects one of the data output from the plurality of memory cells and outputs the selected data from the representative I/O terminal when the data stored in the plurality of memory cells is output while in the test mode; and a dummy circuit which is provided between the non-representative I/O terminal and the memory cell associated with the non-representative I/O terminal.

The dummy circuit according to the embodiment includes an element having a delay time equivalent to that of the selection circuit.

According to the embodiment of the invention, data stored in the plurality of memory cells associated with the I/O terminals configured in the block are selected by the selection circuit. By this means, the data can be caused to be output from the representative I/O terminal independently. Therefore, it is possible to clarify whether data associated with any I/O terminal is defective.

Further, according to the embodiment of the invention, a dummy circuit having an element with delay time similar to that of the selection circuit connected to the representative I/O terminal is provided between the non-representative I/O terminal within a block and the memory cell associated with the non-representative I/O terminal. Hence in the data readout timing in normal operation, the delay difference between the representative I/O terminal and the I/O terminals other than the representative I/O terminal (that is non-representative I/O terminal) can be decreased.

A semiconductor device according to another embodiment of this invention includes first and second external data output terminals, first and second data lines, a selection circuit, and a dummy circuit. The first and second data lines correspond to the first and second external data output terminals, respectively, to output data read from memory cells associated to them. The selection circuit selects one of the first and second data lines in response to a test mode signal and connects the selected data line to the first external data output terminal. The dummy circuit is provided between the second data line and the second external data output terminal, and includes an element having a delay time equivalent to that of the selection circuit.

Figure 1:
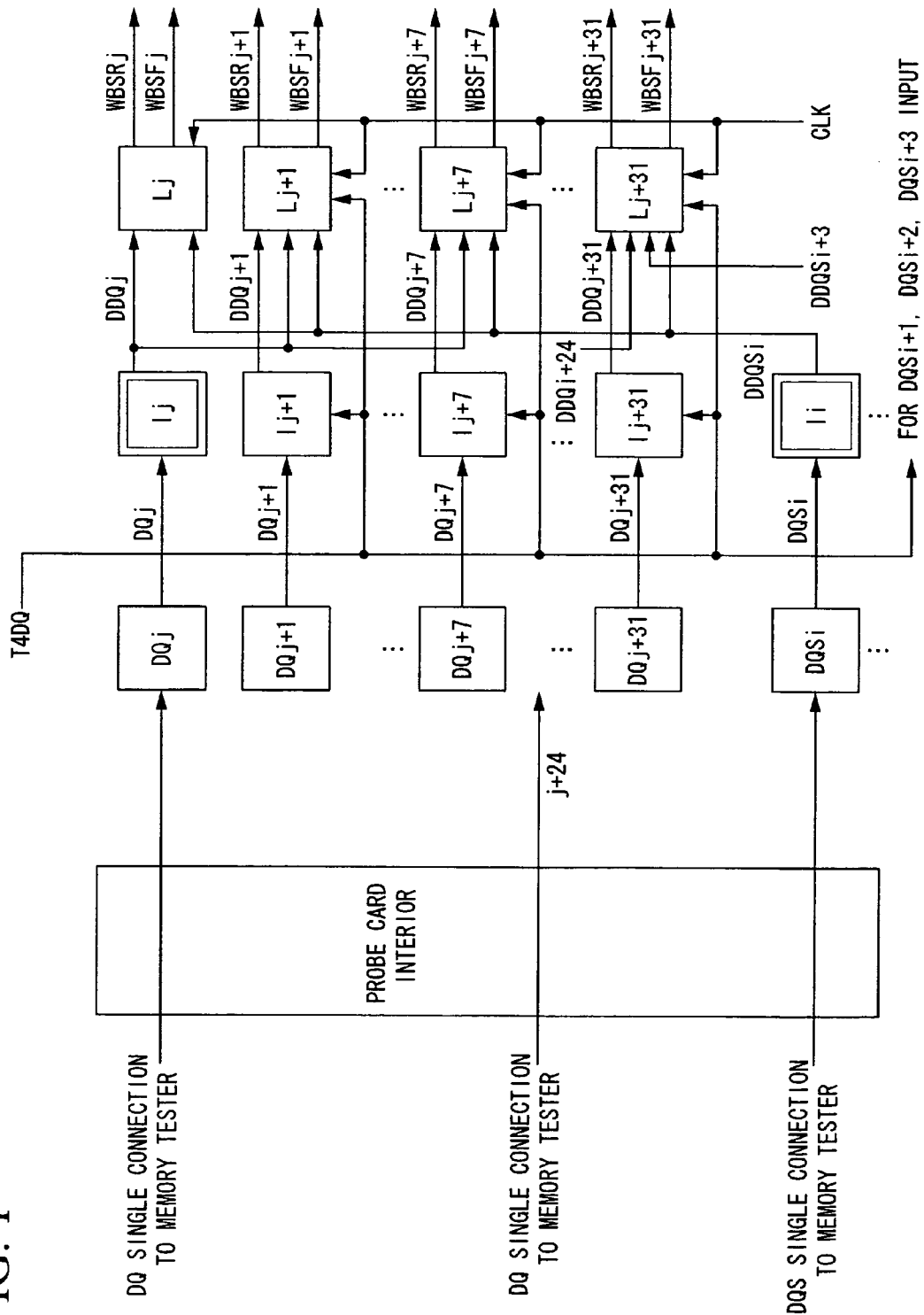
FIG. 1 is a block diagram showing an example of a configuration of a data input circuit according to a first embodiment of the present invention which inputs data to be stored in memory cells.

Below, the semiconductor storage device according to a first embodiment of the invention is explained, referring to the drawings. FIG. 1 is a block diagram showing an example of the configuration of the data input circuit according to the present embodiment which inputs data for writing to memory (memory cells) in FIG. 8.

In FIG. 1, an explanation is given in a case where for example there are 32 I/O terminals which perform data input/output for the memory cells.

Hence 32 bonding pads DQj through DQj+31, which are DQ pads corresponding to I/O (hereafter DQ) terminals, are provided in the data input circuit. Four bonding pads DQSi to DQSi+3, which are I/O terminals to input and output DQS signals controlling input of eight respective I/O terminals, are provided in the data input circuit.

As I/O terminal blocks, the bonding pads DQj to DQj+31 which are the entirety of the 32 I/O terminals are divided, for example, by a factor of eight, into the bonding pads DQj to DQj+7, the bonding pads DQj+8 to DQj+15, the bonding pads DQj+16 to DQj+23, and the bonding pads DQj+24 to DQj+31. In this way, the bonding pads DQj to DQj+31 are divided into four blocks, each including eight I/O terminals.

In the data input circuit with the above-described configuration, probes of the probe card of the tester are erected only for the bonding pads DQj, DQj+8, DQj+16, DQj+24 of the representative DQ terminals (for example, the bonding pads having reference numbers which are multiples of 8), which are specific DQ terminals, and for the bonding pad DQS through which DQS signals are input and output (that is, probes are connected singly to only the bonding pads DQj, DQj+8, DQj+16, DQj+24, and to the bonding pad DQS).

The bonding pads DQj to DQj+31 are each connected to corresponding respective input initial-stage circuits Ij to Ij+31.

Each of the input initial-stage circuits Ij to Ij+31 takes as inputs the respective data signals DQj to DQj+31 from the corresponding bonding pads DQj to DQj+31, and outputs data signals DDQj to DDQj+31 to the later-stage latch circuits Lj to Lj+31.

Each of the input initial-stage circuits Ij, Ij+8, Ij+16, Ij+24 is a branch circuit, and outputs the respective input data signals DDQj, DDQj+8, DDQj+16, DDQj+24 to all of the latch circuits in each of the corresponding blocks.

The test mode signal T4DQ is input to the input initial-stage circuits other than the input initial-stage circuits Ij, Ij+8, Ij+16, Ij+24 corresponding to the representative DQ terminals, that is, to the input initial-stage circuits Ij+1 to Ij+7, Ij+9 to Ij+15, Ij+17 to Ij+23, and Ij+25 to Ij+31 corresponding to the non-representative DQ terminals. When the test mode signal T4DQ is input to the input initial-stage circuits Ij+1 to Ij+7, Ij+9 to Ij+15, Ij+17 to Ij+23, and Ij+25 to Ij+31, these are in the test mode state, and the output goes to high impedance. On the other hand, when the test mode signal T4DQ is not input to the input initial-stage circuits Ij+1 to Ij+7, Ij+9 to Ij+15, Ij+17 to Ij+23, and Ij+25 to Ij+31, these each output the data input from the corresponding DQ terminals.

The above latch circuits Lj to Lj+31 temporarily store the respective input data signals DDQj to DDQj+31.

That is, the data signals DDQj, DDQj+8, DDQj+16, DDQj+24 from the bonding pads DQj, DQj+8, DQj+16, DQj+24 on which probe needles are erected, are input to the respective input initial-stage circuits Ij to Ij+7, Ij+8 to Ij+15, Ij+16 to Ij+23, and Ij+24 to Ij+31 as the same data for each of the blocks. For example, the date signal DDQj is input to initial-stage circuits Ij to Ij+7.

As a result, the data signal DDQj is input not only to the latch circuit Lj, but also to the latch circuits Lj+1 to Lj+7 (latch circuits corresponding to bonding pads on which a probe needle is not erected). The data signal DDQj+8 is input not only to the latch circuit Lj+8, but also to the latch circuits Lj+9 to Lj+15 (latch circuits corresponding to bonding pads on which a probe needle is not erected). The data signal DDQj+16 is input not only to the latch circuit Lj+16, but also to the latch circuits Lj+17 to Lj+23 (latch circuits corresponding to bonding pads on which a probe needle is not erected). And, the data signal DDQj+24 is input not only to the latch circuit Lj+24, but also to the latch circuits Lj+25 to Lj+31 (latch circuits corresponding to bonding pads on which a probe needle is not erected).

Each of the above-described latch circuits Lj to Lj+31 latches the respective input data signals DDQj to DDQj+31 by means of a DQS signal, described below.

A test mode signal T4DQ is input to the latch circuits other than the latch circuits Lj, Lj+8, Lj+16 and Lj+24 corresponding to representative DQ terminals, that is, to the latch circuits Lj+1 to Lj+7, Lj+9 to Lj+15, Lj+17 to Lj+23, and Lj+25 to Lj+31. When the test mode signal T4DQ is input, the latch circuits Lj+1 to Lj+7, Lj+9 to Lj+15, Lj+17 to Lj+23, and Lj+25 to Lj+31 are in the test mode state, and are in a state in which the output of the input initial-stage circuit corresponding to the representative DQ terminal of each block is input, rather than the output of the respective corresponding input initial-stage circuits. On the other hand, when a test mode signal T4DQ is not input, the outputs of the respective corresponding input initial-stage circuits are input to the latch circuits Lj+1 to Lj+7, Lj+9 to Lj+15, Lj+17 to Lj+23, and Lj+25 to Lj+31.

The input initial-stage circuits Ii to Ii+3 are input initial-stage circuits for DQS signals, to which the respective DQS signals DDQSi to DDQSi+3 are input. In the case of normal operation, the DQS signals DDQSi to DDQSi+3 are input to the latch circuits Lj to Lj+31 divided into four blocks each including eight DQ terminals, as described below. That is, the DQS signal DDQSi is input to the latch circuits Lj to Lj+7. The DQS signal DDQSi+1 is input to the latch circuits Lj+8 to Lj+15. The DQS signal DQSi+2 is input to the latch circuits Lj+16 to Lj+23. And, the DQS signal DDQSi+3 is input to the latch circuits Lj+24 to Lj+31. In the case of test mode operation, only the DQS signal DDQSi is input to all of the latch circuits Lj to Lj+31.

The test mode signal T4DQ is input to each of the input initial-stage circuits Ij+1 to Ij+7, Ij+9 to Ij+15, Ij+17 to Ij+23, Ij+25 to Ij+31, and Ii+1 to Ii+3 corresponding to the DQ terminals and DQS terminals on which probe needles are not erected, and to the latch circuits Lj+1 to Lj+7, Lj+9 to Lj+15, Lj+17 to Lj+23, and Lj+25 to Lj+31.

A clock signal CLK is input to all of the latch circuits Lj to Lj+31. Clock signal CLK rising-edge write bus signals WBSRj to WBSRj+31 and clock signal CLK falling-edge write bus signals WBSFj to WBSFj+31 are output from the respective latch circuits Lj to Lj+31. The latch circuits Lj to Lj+31 are connected to sense amplifiers which write data to memory cells.

Figure 2:
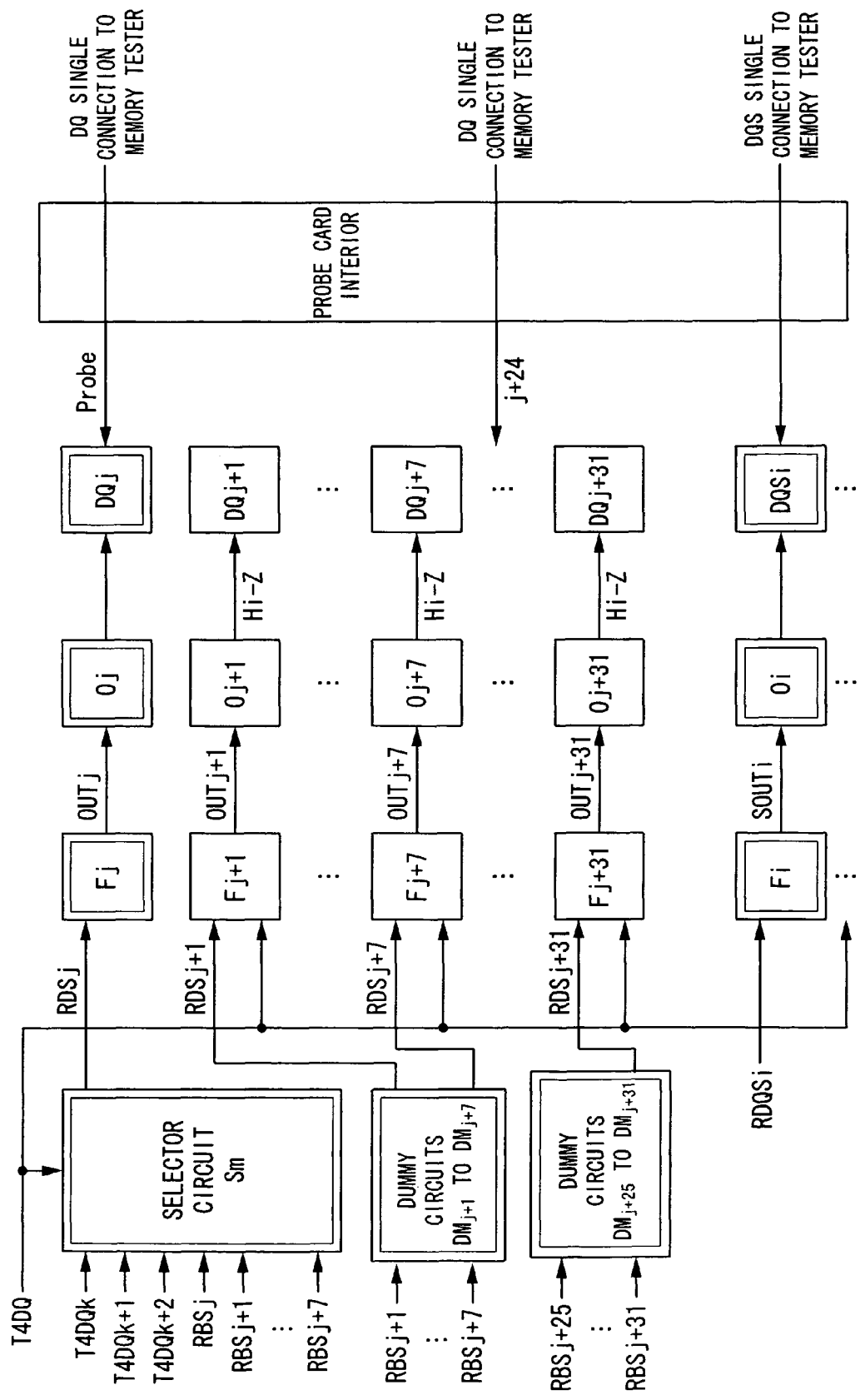
FIG. 2 is a block diagram showing an example of a configuration of a data output circuit according to the embodiment of the present invention which outputs data stored in the memory cells.

FIG. 2 is a block diagram showing an example of the configuration of a data output circuit according to the present embodiment which outputs data read-out from memory (memory cells) in FIG. 8.

The read bus signals RBSj to RBSj+31 input from memory cells via sense amplifiers are equally divided by four, that is, divided into four blocks of 8 data signals each. The read bus signals divided into four blocks are input to the respective selector circuits Sm to Sm+3 in block units.

That is, the read bus signals RBSj to RBSj+7 are input to the selector circuit Sm. The read bus signals RBSj+8 to RBSj+15 are input to the selector circuit Sm+1. The read bus signals RBSj+16 to RBSj+23 are input to the selector circuit Sm+2. And, the read bus signals RBSj+24 to RBSj+31 are input to the selector circuit Sm+3.

Test mode signals T4DQk to T4DQk+2 for test DQ output selection from a control circuit not shown are input to each of the selector circuits Sm to Sm+3.

Each of the selector circuits Sm to Sm+3 outputs one of the eight read bus signals to the next-stage FIFO circuits Fi, Fi+8, Fi+16, Fi+24, according to the combination of signal levels of the test mode signals T4DQk to T4DQk+2.

Each of the FIFO circuits Fi to Fi+31 is a first-in first-out memory circuit which stores, in time-series order, the read bus signals RBSj to RBSj+31.

Read bus signals for which needles are not erected, that is, corresponding to DQ terminals other than the representative DQ terminals, are input to a dummy circuit DM which performs stage adjustment to adjust delays.

That is, read bus signals RBSj+1 to RBSj+7 are input to the respective dummy circuits DMj+1 to DMj+7. Read bus signals RBSj+9 to RBSj+15 are input to the respective dummy circuits DMj+9 to DMj+15. Read bus signals RBSj+17 to RBSj+23 are input to the respective dummy circuits DMj+17 to DMj+23. And, read bus signals RBSj+25 to RBSj+31 are input to the respective dummy circuits DMj+25 to DMj+31.

The read bus signals RBSj to RBSj+31 output from the selector circuit Sm, the dummy circuits DMj+1 to DMj+7, the selector circuit Sm+1, the dummy circuits DMj+9 to DMj+15, the selector circuit Sm+2, the dummy circuits DMj+17 to DMj+23, the selector circuit Sm+3, and the dummy circuits DMj+25 to DMj+31, respectively, are input to the FIFO circuits Fj to Fj+31 respectively.

The dummy circuits already described have internal logic circuits configured such that the delay times are similar to those for the selector circuits.

Output stage circuits Oj to Oj+31 are provided in the latter stages of each of the FIFO circuits Fj to Fj+31. The output signals OUTj to OUTj+31 which are the outputs of the FIFO circuits Fj to Fj+31 are output to the respective output stage circuits Oj to Oj+31.

The bonding pads DQj to DQj+31 of the respective DQ terminals are provided in each of the later stages of the output stage circuits Oj to Oj+31.

When the test mode signal T4DQ is input to output stage circuits not corresponding to representative DQ terminals, that is, to the output stage circuits Oj+1 to Oj+7, Oj+9 to Oj+15, Oj+17 to Oj+23, and Oj+25 to Oj+31, the test mode state is entered, and the respective output terminals enter the high impedance state. When the test mode signal is not input to the output stage circuits Oj+1 to Oj+7, Oj+9 to Oj+15, Oj+17 to Oj+23, and Oj+25 to Oj+31, the state is the normal operation state, and the OUT signals from the corresponding respective FIFO circuits Fj+1 to Fj+7, Fj+9 to Fj+15, Fj+17 to Fj+23, Fj+25 to Fj+31 are output.

During readout in normal operation when the test mode signal T4DQ is not input, by means of the above-described configuration, the output signals OUTj to OUTj+31 from the respective FIFO circuits Fj to Fj+31 are input to the respective output stage circuits Oj to Oj+31, and the data signals DQj to DQj+31 output from the output stage circuits Oj to Oj+31 are output to the bonding pads DQj to DQj+31 of the respective corresponding DQ terminals.

The read bus signals RBSj to RBSj+7, the read bus signals RBSj+8 to RBSj+15, the read bus signals RBSj+16 to RBSj+23, and the read bus signals RBSj+24 to RBSj+31, are respectively input to the selector circuits Sm, Sm+1, Sm+2 and Sm+3. When the test mode signal T4DQ is not input, the selector circuits Sm, Sm+1, Sm+2 and Sm+3 output only the read bus signals RBSj, RBSj+8, RBSj+16, RBSj+24.

On the other hand, during readout in test mode when the test mode signal T4DQ is input, the selector circuit Sm selects and outputs one among the read bus signals RBSj to RBSj+7 to the FIFO circuit Fi, according to the combination of the test mode signals T4DQk to T4DQk+2 (that is, the combination of the "H" levels and "L" levels of each of the test mode signals). For example, suppose that the signal levels of the test mode signals T4DQk to T4DQk+2 input to the selector circuit Sm are incremented in order from {0,0,0} to {1,1,1} (that is, from {L,L,L} to {H,H,H}). In this case, the selector circuit Sm selects and outputs, synchronized with this incrementing and in time-series order, one each of the read bus signals RBSj to RBSj+7.

Similarly, each of the selector circuits Sm+1, Sm+2 and Sm+3 selects and outputs one read bus signal among the read bus signals in the blocks RBSj+8 to RBSj+15, RBSj+16 to RBSj+23, RBSj+24 to RBSj+31 corresponding to the respective FIFO circuits Fi+8, Fi+16, Fi+24, according to combination of the test mode signals T4DQk to T4DQk+2.

The FIFO circuits Fj+1 to Fj+7, Fj+9 to Fj+15, Fj+17 to Fj+23, and Fj+25 to Fj+31 are FIFO circuits corresponding to DQ terminals which are not representative DQ terminals. When the test mode signal T4DQ is not input, in normal operation the FIFO circuits Fj+1 to Fj+7, Fj+9 to Fj+15, Fj+17 to Fj+23, and Fj+25 to Fj+31 perform first-in first-out input/output operation of the respective read bus signals input from the dummy circuits DMj+1 to DMj+7, DMj+9 to DMj+15, DMj+17 to DMj+23, and DMj+25 to DMj+31. When the test mode signal T4DQ is input, the FIFO circuits Fj+1 to Fj+7, Fj+9 to Fj+15, Fj+17 to Fj+23, and Fj+25 to Fj+31 are in the test mode state and so do not operate, and output "L" level as the output signal.

As explained above, in the test mode state, data read out from memory is input to the selector circuits Sm to Sm3 of each of the blocks so as to be output from the representative DQ terminals provided in each of the DQ terminal blocks, and is output from the representative DQ terminals according to the combination of signal levels of test mode signals T4DQk to T4DQk+2.

Figure 3:
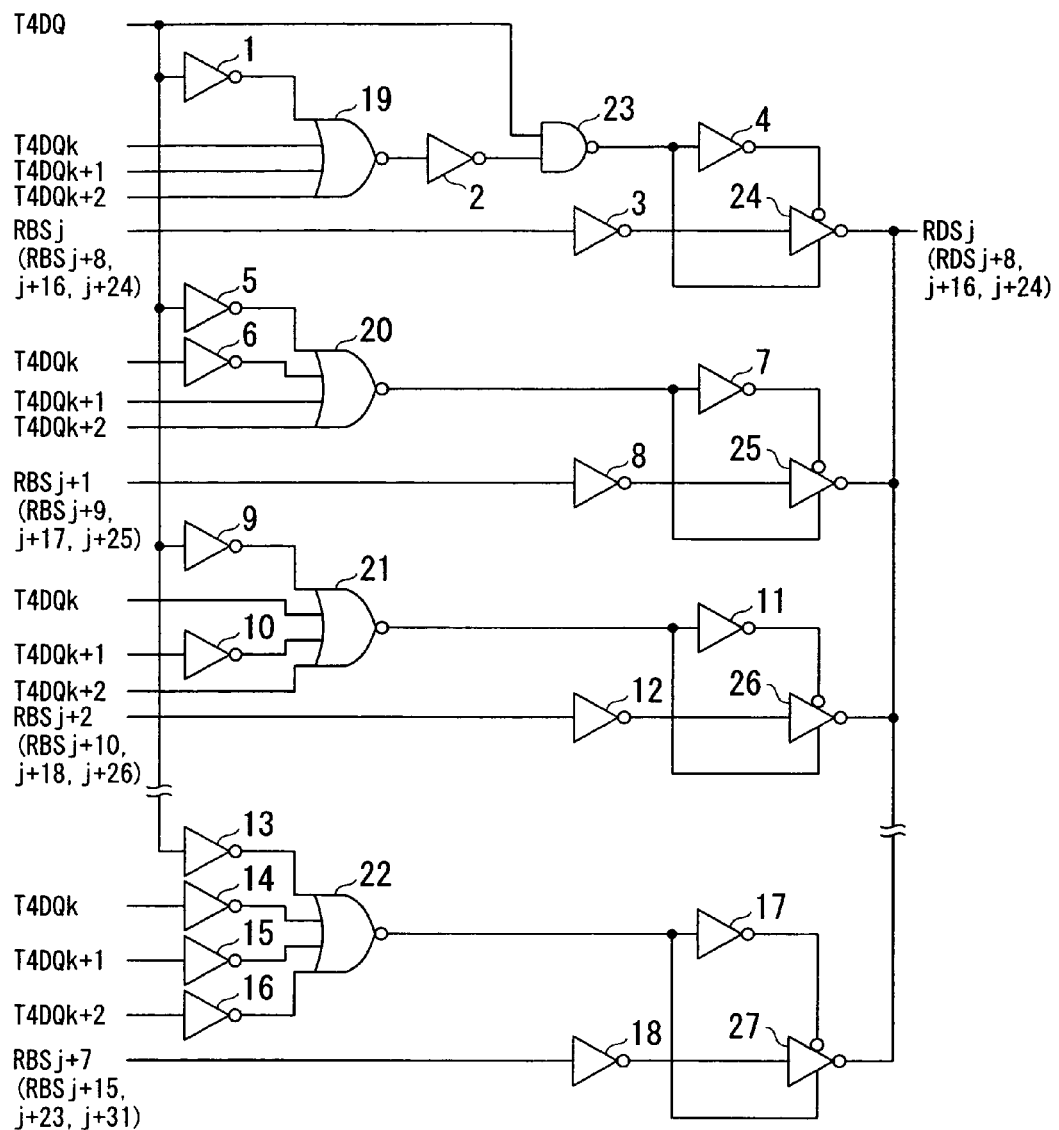
FIG. 3 is a circuit diagram showing an example of a configuration of a selector circuit shown in FIG. 2.

Next, the configuration of the selector circuit Sm in FIG. 2 is explained with reference to FIG. 3. FIG. 3 is a circuit diagram showing an example of the configuration of the selector circuit Sm according to the present embodiment. The other selector circuits Sm+1, Sm+2 and Sm+3 are also configured similarly to the selector circuit Sm shown in FIG. 3. FIG. 3 shows only the configuration of the circuits corresponding to the read bus signals RBSj to RBSj+2 (or RBSj+8 to RBSj+10, RBSj+16 to RBSj+18, or RBSj+24 to RBSj+26), the configuration of the circuits corresponding to the other read bus signals RBSj+3 to RBSj+6 (or RBSj+11 to RBSj+14, RBSj+19 to RBSj+22, or RBSj+27 to RBSj+30) is similar to these.

The selector circuit Sm includes for example inverters 1 to 18, NOR circuits 19 to 22, a NAND circuit 23, and switched inverters 24 to 27.

When the output from the NAND circuit 23 is at "H" level, the switched inverter 24 outputs from the output terminal a signal level according to the output of the inverter 3, and when the output from the NAND circuit 23 is at "L" level, the output terminal is at high impedance.

When the outputs of the NOR circuits 20, 21 and 22 are at "H" level, each of the switched inverters 25, 26 and 27 outputs from the output terminal a signal level according to the outputs of the inverters 8, 12 and 18 (that is, they enter the conducting state). On the other hand, when the outputs from the NOR circuits 20, 21 and 22 are "L" level, the output terminals of the switched inverters 25, 26 and 27 are at high impedance.

Figures 4, 5:
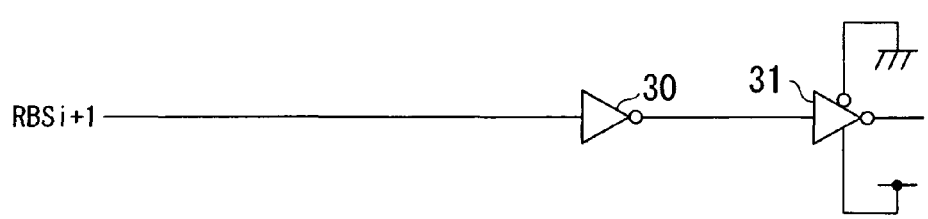
FIG. 4 is a truth table which explains operation of the selector circuit shown in FIG. 3.
FIG. 5 is a circuit diagram showing an example of a configuration of a dummy circuit shown in FIG. 2.

FIG. 4 is a truth table which explains which of the read bus signals RBSj to RBSj+7 (or, which of the read bus signals RBSj+8 to RBSj+15, RBSj+16 to RBSj+23, or RBSj+24 to RBSj+31) is selected by the selector circuit Sm (or, by the selector circuits Sm+1 to Sm+3), according to the combination of signal levels of the test mode signals T4DQk to T4DQk+2. When the test mode signal T4DQ is input, that is, when the test mode signal T4DQ is at "H" level, the selector circuit Sm selects one among the read bus signals RBSj to RBSj+7 and outputs the selected signal, according to the combination of the signal levels of the test mode signals T4DQk to T4DQk+2, as indicated in the truth table of FIG. 4.

On the other hand, when the test mode signal T4DQ is not input, that is, when the test mode signal T4DQ is at "L" level, the switched inverter 24 is in the conducting state regardless of the signal levels of the test mode signals T4DQk to T4DQk+2, and the output terminals of the switched inverters 25 to 27 are at high impedance. As a result, the selector circuit Sm outputs only the signal level of the read bus signal RBSj.

Similarly to the above-described selector circuit Sm, the signals output by the other selector circuits Sm+1, Sm+2 and Sm+3 also change according to whether the test mode signal T4DQ is input (that is, according to whether the state is the test mode state or the normal operation state). That is, when the state is the test mode state, the selector circuits Sm+1, Sm+2 and Sm+3 select one signal from among the eight read bus signals RBSj+8 to RBSj+15, RBSj+16 to RBSj+23, and RBSj+24 to RBSj+31, respectively, according to the combination of the levels of the test mode signals T4DQi to T4DQi+2. On the other hand, when in the normal operation state, the selector circuits Sm+1, Sm+2 and Sm+3 output only the levels of the respective read bus signals RBSj+8, RBSj+16, RBSj+24.

Next, the configuration of the dummy circuit DMj+1 in FIG. 2 is explained with reference to FIG. 5. FIG. 5 is a circuit diagram showing an example of the configuration of a dummy circuit according to the present embodiment. The configurations of the other dummy circuits DMj+2 to DMj+7, DMj+9 to DMj+15, DMj+17 to DMj+23, and DMj+25 to DMj+31, are similar to the configuration of the dummy circuit DMj+1 in FIG. 5.

These dummy circuits DMj+1 to DMj+7, DMj+9 to DMj+15, DMj+17 to DMj+23, and DMj+25 to DMj+31, are provided in order to adjust the number of stages of the logic circuit relative to the selector circuits Sm, Sm+1, Sm+2, Sm+3 provided corresponding to the representative DQ terminals, that is, in order to adjust the delays in the output of data in the normal operation state.

The dummy circuit DMj+1 is formed by connecting in series an inverter 30 and a switched driver 31, the delay time of which is equivalent to that of the inverters 1 to 17 and switched drivers 24 to 27 in FIG. 3.

Figure 6:
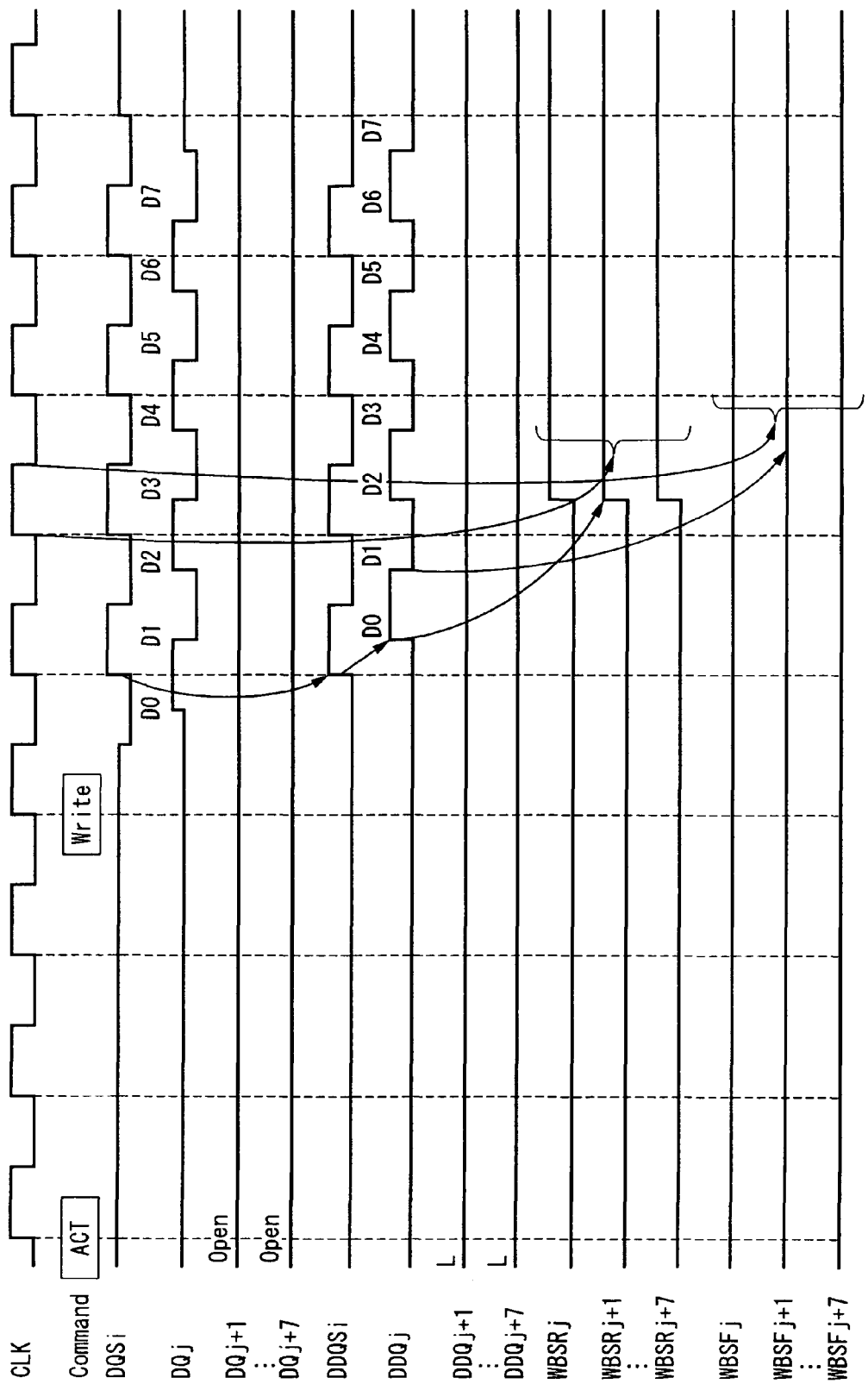
FIG. 6 is a timing chart which explains an example of data input operation in the input circuit shown in FIG. 1.

Next, FIG. 1 and FIG. 6 are used to explain data write processing in the test mode state according to the present embodiment. FIG. 6 is a timing chart which explains an example of data write processing operation in the test mode state. Below, data write processing in the block of DQ terminals for the bonding pads DQj to DQj+7 is explained. Data write processing in the DQ terminal blocks for the other bonding pads DQj+8 to DQj+15, DQj+16 to DQj+23, and DQj+24 to DQj+31 is similar, and so explanations are omitted.

In the test mode state, when a write processing command (Write) is input, data input from outside the DQ terminal to the bonding pad DQj corresponding to the representative DQ terminal is output from the input initial-stage circuit Ij to the latch circuit Lj and to the latch circuits Lj+1 to Lj+7 corresponding to the other DQ terminals in the block, as the data DDQj.

And, the data is input from the respective latch circuits Lj to Lj+7 to the sense amplifier for writing to memory as the word bus signals WBSRj to WBSRj+7.

Figure 7:
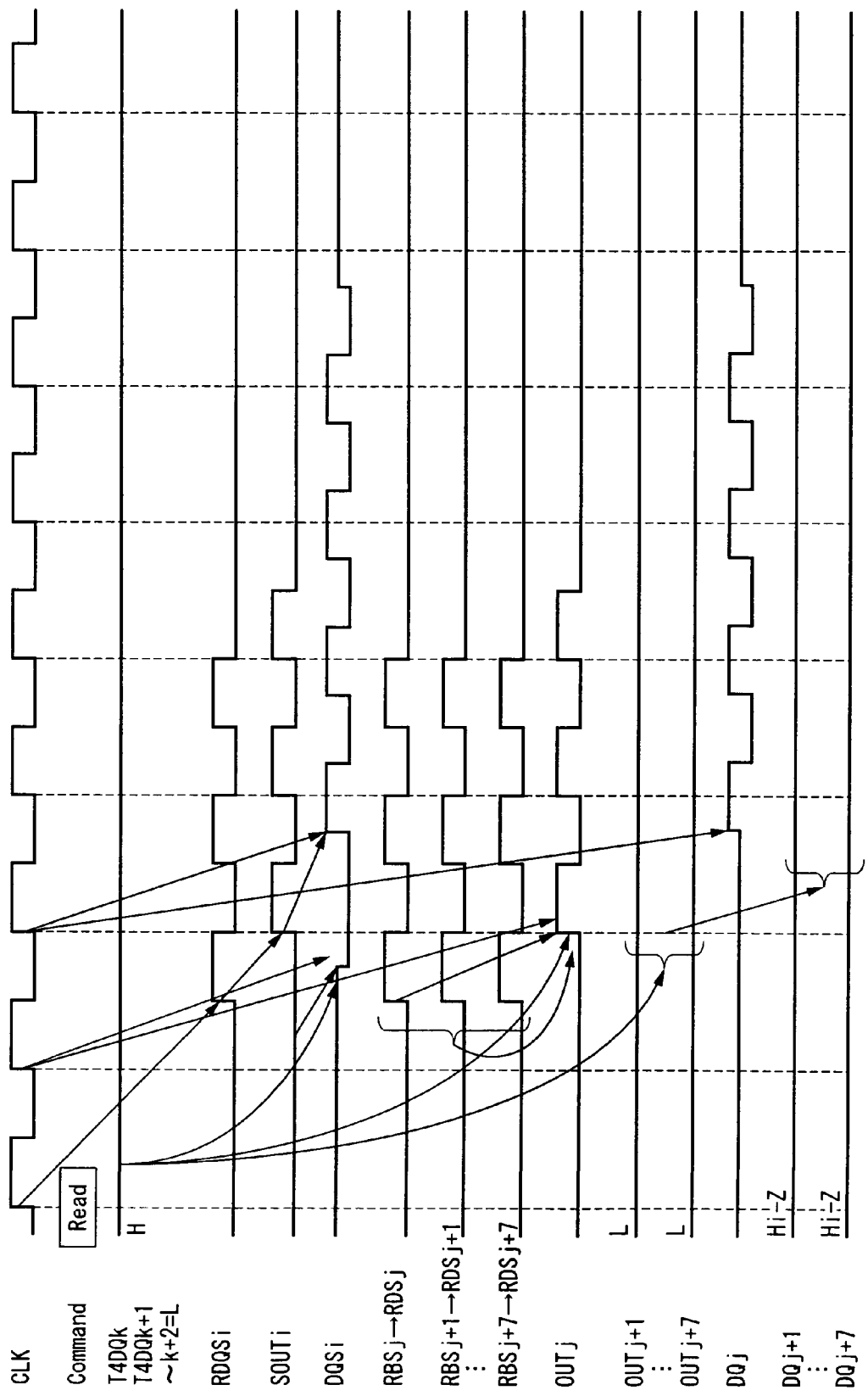
FIG. 7 is a timing chart which explains an example of data output operation in the output circuit shown in FIG. 2.

Next, FIG. 2 and FIG. 7 are used to explain data read processing in the test mode state according to the present embodiment. FIG. 7 is a timing chart which explains an example of data read processing operation in the test mode state. Below, data read processing is explained for the block of DQ terminals of the bonding pads DQj to DQj+7, but the data read processing is similar for the blocks of DQ terminals of the other bonding pads DQj+8 to DQj+15, DQj+16 to DQj+23, and DQj+24 to DQj+31, and so explanations are omitted. In FIG. 6 and FIG. 7, timing charts for the bonding pads DQSi+1 to DQSi+3 are omitted, but are similar to the timing chart for the bonding pad DQSi. Below, the state is explained when the test mode signal T4DQ is input, and the test mode signals T4DQk to T4DQk+2 are all at "L" level.

In the test mode state, when a read processing command (Read) is input, the read bus signals RBSj to RBSj+7 are output from the sense amplifier to the selector circuit Sm.

At this time, because the test mode signals T4DQk to T4DQk+2 are all input at "L" level, the selector circuit Sm selects the read bus signal RBSj, and outputs the read data signal RDSj to the FIFO circuit Fj. That is, at this time the read bus signals RBSj to RBSj+7 (RDSj to RDSj+7) are always output, but ultimately, only the read bus signal RBSj (RDSj) is selected and output, according to the combination of the above-described signal levels of the test mode signals T4DQk to T4DQk+2.

The read bus signals RBSj+1 to RBSj+7 are respectively input to the other FIFO circuits Fj+1 to Fj+7 from the dummy circuits DMj+1 to DMj+7. However, because the test mode signal T4DQ is input, the output signals OUTj+1 to OUTj+7 of the FIFO circuits Fj+1 to Fj+7 remain at "L" level.

The FIFO circuit Fj performs first-in/first-out processing of the input read bus signal RDSj, and outputs the signal as the output signal OUTj to the output stage circuit Oj, in sequence and synchronized with the CLK signal input from outside.

And, 2CLK after input of the read processing command, the output signal OUTj is output from the representative DQ terminal to the bonding pad DQj.

Because the test mode signal T4DQ is input, the output stage circuits Oj+1 to Oj+7 corresponding to the DQ terminals other than the representative DQ terminal are in the high impedance state.

Similarly, due to the test mode signal T4DQ only the DQS signal DQSi is output, and the other DQS signals DQSi+1 to DQSi+3 are at high-impedance output.

In each of the circuits corresponding to the blocks of the other DQ terminals, for the bonding pads DQj+8 to DQj+15, DQj+16 to DQj+23, and DQj+24 to DQj+31, and the bonding pads DQSi+1, DQSi+2 and DQSi+3, operation is similar according to the combination of the signal levels of the test mode signal T4DQ and T4DQk to T4DQk+2.

In the above-described operation, the selector circuit Sm (or the selector circuits Sm+1 to Sm+3) according to the present embodiment selects one among the read bus signals RBSj to RBSj+7 (or, among the read bus signals RBSj+8 to RBSj+15, RBSj+16 to RBSj+23, or RBSj+24 to RBSj+31) for each block input from the sense amplifier, according to the combination of the "H" level/"L" level of the test mode signals T4DQk to T4DQk+2 appearing in the truth table shown in FIG. 4, and outputs the signal to the bonding pad DQj (or the bonding pads DQj+8, DQj+16, or DQj+24) corresponding to the representative DQ terminal via the output stage circuit Oj (or to the output stage circuits Oj+8, Oj+16, or Oj+24).

When the test mode signal T4DQ is inactive that is "L" level (during normal operation), the selector circuit Sm (or the selector circuits Sm+1 to Sm+3) is used in other than the test mode state to select only the read bus signal RBSj (or, the read bus signal RBSj+8, RBSj+16, or RBSj+24).

Also, in normal operation, a two-stage logic circuit is required in the selector circuit Sm (or, Sm+1 to Sm+3) only for the path through which the read bus signals RDSj, RDSj+8, RDSj+16, RDSj+24 pass. For example, in FIG. 3, the two-stage logic circuit of the inverter 3 and switched inverter 24 is used for the read bus signal RDSj.

However, in normal operation, not only the read bus signals RDSj, RDSj+8, RDSj+16 and RDSj+24, but also the read bus signals RDSj+1 to RDSj+7, RDSj+9 to RDSj+15, RDSj+17 to RDSj+23, and RDSj+25 to RDSj+31, are also used (that is, all of the read bus signals RDSj to RDSj+31 are used). Hence a delay difference occurs between read bus signals passing through the selector circuit Sm, and read bus signals not passing through the circuit, due to the difference in the number of logic circuit stages.

Without further modification, a difference occurs in the data output time delays between DQ terminals. With the object of eliminating this delay, logic stages (that is, dummy circuits DMj+1 to DMj+7, DMj+9 to DMj+15, DMj+17 to DMj+23, and DMj+25 to DMj+31) are provided in the paths of the read bus signals RDSj+1 to RDSj+7, RDSj+9 to RDSj+15, RdSj+17 to RDSj+23, and RDSj+25 to RDSj+31 which do not pass through the selector circuits Sm to Sm+3 in normal operation, as shown in FIG. 5. By this means, skew of the read bus signals is adjusted between the representative DQ terminals and the other DQ terminals.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor storage device, comprising:
    a plurality of I/O terminals configured in a block, and including a representative I/O terminal and a non-representative I/O terminal;
    a plurality of memory cells each associated with said plurality of I/O terminals to store data;
    a data input portion to which data to be stored in said plurality of memory cells is input; and
    a data output portion which outputs data stored in said plurality of memory cells,
    said data input portion including a branch circuit which distributes the data input to said representative I/O terminal to all of said plurality of memory cells when the data to be stored in said plurality of memory cells is input while in test mode, and
    said data output portion including:
        a selection circuit which is connected to said representative I/O terminal, and which selects one of the data output from said plurality of memory cells and outputs the selected data from said representative I/O terminal when the data stored in said plurality of memory cells is output while in the test mode; and
        a dummy circuit which is provided between said non-representative I/O terminal and said memory cell associated with said non-representative I/O terminal, and reduces a delay difference of the data which said representative I/O terminal and said non-representative I/O terminal output, respectively, in a normal operation.

2. The semiconductor storage device according to claim 1, wherein said dummy circuit includes an element having a delay time equivalent to that of said selection circuit.

3. The semiconductor storage device according to claim 2, wherein:
    said data output portion further includes a plurality of data holding portions each of which is provided for each of said plurality of I/O terminals, which hold the data output from said memory cells in synchronization with a CLK signal input from outside; and
    said selection circuit and said dummy circuit are provided in a stage prior to said data holding portions.

4. The semiconductor storage device according to claim 3, wherein said data holding portions provided on a side of said dummy circuit operate in a mode other than the test mode.

5. The semiconductor storage device according to claim 1, wherein said selection circuit has a plurality of drivers an output of which has a wired-OR configuration, inputs of the drivers are respectively connected to one among data lines which output the data output from the memory cells, and the power supply of said drivers is controlled by a test mode signal.

6. A semiconductor storage device, comprising:
    first and second external data output terminals;
    first and second data lines which correspond to said first and second external data output terminals, respectively, to output data read from memory cells associated thereto;
    a selection circuit which selects one of said first and second data lines in response to a test mode signal and connects the selected data line to said first external data output terminal; and
    a dummy circuit which is provided between said second data line and said second external data output terminal, operates in a normal operation, and includes an element having a delay time equivalent to that of said selection circuit.

7. The semiconductor storage device according to claim 6, wherein a first data output portion including said selection circuit, and a second data output portion including said dummy circuit, each further including a data holding portion which holds data output from said memory cells in synchronization with a CLK signal input from outside.

8. The semiconductor storage device according to claim 7, wherein said data holding portion of said second data output portion is positioned between said dummy circuit and said second external data output terminal.

9. The semiconductor storage device according to claim 7, wherein said data holding portion of said second data output portion operates in a mode other than the test mode.

10. The semiconductor storage device according to claim 8, wherein said data holding portion of said second data output portion operates in a mode other than the test mode.

11. A control method for a semiconductor storage device, said method comprising:
    reading data stored in first and second memory cells to first and second data lines, respectively;
    selecting one among the first and second data by a selection portion in response to a active state of a test mode signal in a test mode;
    outputting selected data to a first external data output terminal in the test mode; and
    outputting the first data via the selection portion to said first external data output terminal in a normal operation, and outputting the second data to the second external data output terminal with adding a delay time equivalent to that of said selection portion to the second data by a dummy portion, in response to an inactive state of the test mode in the normal operation.

12. The control method for a semiconductor storage device according to claim 11, wherein the second data is output to one of said first external data output terminal and said second external data output terminal in synchronization with a CLK signal input from outside.

13. The control method for a semiconductor storage device according to claim 11, wherein:
the first data is output to said first external data output terminal in synchronization with a CLK signal input from outside after one among the first and second data is selected; and
the second data is output to said second external data output terminal in synchronization with the CLK signal input from outside after a time equivalent to a delay time of said selection portion is added to the second data.

14. The control method for a semiconductor storage device according to claim 12, wherein:
the first data is output to said first external data output terminal in synchronization with the CLK signal input from outside after one among the first and second data is selected, in the test mode; and
the second data is output to said second external data output terminal in synchronization with the CLK signal input from outside after a time equivalent to a delay time of said selection portion is added to the second data, in the normal operation.

* * * * *